(12) United States Patent
Seevinck et al.

(10) Patent No.: US 6,205,070 B1
(45) Date of Patent: Mar. 20, 2001

(54) CURRENT SENSE AMPLIFIER

(75) Inventors: Evert Seevinck, Eersel; Lodewijk P. Bellefroid; Rene Segaar, both of Eindhoven, all of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/464,856

(22) Filed: Dec. 16, 1999

(30) Foreign Application Priority Data

Dec. 22, 1998 (EP) .................................................. 98204380

(51) Int. Cl.[7] ...................................................... G11C 7/00
(52) U.S. Cl. ............................................ 365/205; 307/530
(58) Field of Search ..................................... 365/196, 205, 365/207; 307/530

(56) References Cited

U.S. PATENT DOCUMENTS

| | | | |
|---|---|---|---|
| 4,766,333 | * | 8/1988 | Mobley ................................. 307/530 |
| 4,771,194 | * | 9/1988 | Van Zeghbroeck ................... 309/530 |
| 5,253,137 | | 10/1993 | Seevinck ......................... 365/230.01 |

* cited by examiner

Primary Examiner—David Nelms
Assistant Examiner—Thong Le
(74) Attorney, Agent, or Firm—Brian J. Wieghaus

(57) ABSTRACT

A memory in an integrated circuit contains a current sense amplifier. The current sense amplifier contains a first and second input transistor with cross-coupled gates and drains, each transistor having a source coupled to a respective memory bit line. The current from the drains of the first and second input transistor is guided to source-drain channels of the first and second load transistor respectively. The drains of the first and second input transistor are coupled to a common node via source-gate links of the first and second load transistor respectively. The gate/source voltage drops of the first and second load transistor are arranged in a direction opposite to a direction of gate/source voltage drops of the first and second input transistor between the complementary bit lines and the common node.

9 Claims, 2 Drawing Sheets

CURRENT SENSE AMPLIFIER

BACKGROUND OF THE INVENTION

1. Field of the Invention

The invention relates to an integrated circuit as described in the precharacterizing part of claim 1.

2. Description of Related Art

U.S. Pat. No. 5,253,137 discloses a memory with a current sense amplifier. The current sense amplifier adjusts the currents drawn from a pair of complementary bitlines so that the potential difference between the bitlines remains constantly zero. The current difference is used to generate a memory output signal. By keeping the potential difference between the bitlines constant, delays needed for charging and equalizing the bitlines are avoided.

The memory according to U.S. Pat. No. 5,253,137 has two power supply connections. Inputs of the sense amplifiers are connected to the first power supply connection via respective ones of the bit lines. The sense amplifier contains two current branches. Each input of the sense amplifier is connected to the second power supply connection via its own current branch. Each current branch contains the source/drain channel of a PMOS input transistor and a PMOS load transistor successively between the bitline and the second power supply connection. The gate of the input transistor in the each branch is cross-coupled to the drain of the input transistor in the other current branch. The gates of the load transistor are coupled to the second power supply connections.

In operation, the sense amplifier equalizes the voltage drop from the inputs of the sense amplifier to the second power supply connection, which forms a common node for the two branches. The gate/source voltage of the input transistor and the load transistor in the same current branch are substantially equal because they draw the same current. The cross-coupling ensures that the voltage drop across each current branch is the sum of the gate source voltage drops of one transistor from each branch.

This circuit has the disadvantage that it needs a power supply voltage of at least two gate/source threshold voltages to operate.

BRIEF SUMMARY OF THE INVENTION

It is an object of the invention to provide an integrated circuit with a memory and a current sense amplifier that operates down to lower supply voltages.

The integrated circuit according to the invention is described in claim 1. In the sense amplifier the gate/source voltage drop of the load transistors is inserted in a direction opposite to the direction of the gate source voltage drop of the input transistors. Thus, the voltage drop from the inputs of the sense amplifier to the common node of the load transistors is the difference of the gate-source voltage drops of an input transistor and a load transistor, instead of a sum as in the prior art. As in the prior art, the cross coupling ensures that the voltage drop from the inputs of the sense amplifier to the common point are equalized. But because these voltage drops between the inputs and the common node are now smaller than in the prior art, a lower supply voltage suffices.

Usually, complementary outputs of a memory cell will be coupled to respective ones of the memory bit-lines; a whole column of memory cells may be connected to the bit-lines in this way, memory selection signals determining which memory cell will be able to affect current through the bit lines. However, one may also use a memory cell with single ended outputs. In that case, one of the bit-lines is coupled to the memory cell and the other bitline may be connected to a reference current source (dummy cell).

In an embodiment of the integrated circuit according to the invention the input transistors and the load transistors are all of the same conductivity type. Thus, the gate-source voltage drops of load transistors and input transistors can easily be made equal by passing the same currents through these transistors.

In another embodiment of the integrated circuit according to the invention the common node is connected to the same power supply connection as the bit lines, via a common current source. Thus, changes in current through the channel of one load transistor will force opposite changes in current through the other load transistor.

In another embodiment the drains of the input transistors are connected to a second power supply connection via a first and second current source respectively. Thus, changes in current through the drains of the input transistors force opposite changes in current through the channels of the load transistors to which these drains are connected. This will make the voltage drops between the inputs and the common node follow each other more closely. Preferably, the first and second current source are switchable, so that they can be switched off if reading from the memory is disabled. More preferably, the first and second current source each comprise a switch for pulling the potential on the drain of the input transistors to the potential of the power supply to which the bit lines are connected. This switches the sense amplifier off more quickly and prevents floating nodes.

BRIEF DESCRIPTION OF THE DRAWINGS

These and other advantageous aspects of the integrated circuit according to the invention will be described using the following figures.

DETAILED DESCRIPTION OF THE INVENTION

Figure 1:
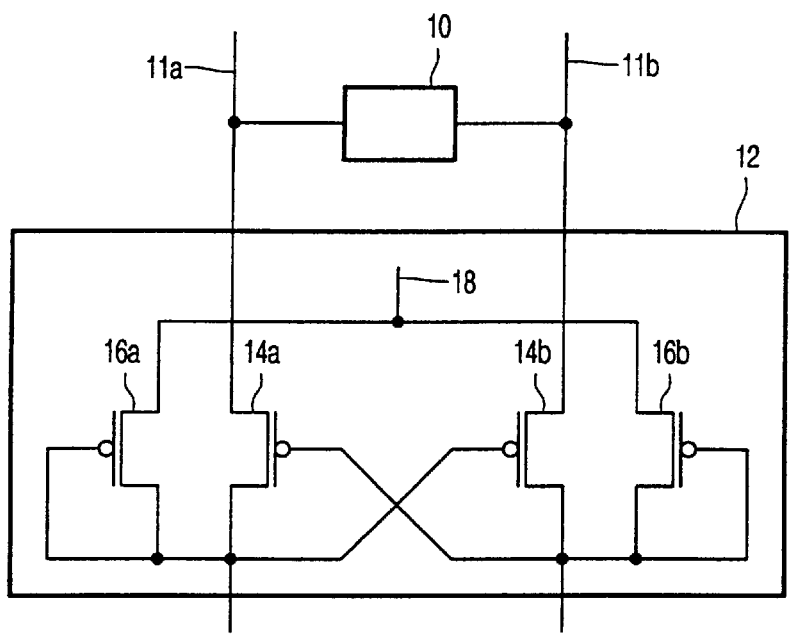
FIG. 1 shows a memory with a sense amplifier

FIG. 1 shows a memory with a sense amplifier. The memory contains memory cells of which one memory cell 10 is shown. The memory cells 10 are organized in columns and the cells 10 in a column are connected to a pair of bitlines 11*a,b*. The bit lines 11*a,b* are connected to a sense amplifier 12.

FIG. 1 illustrates only those aspects of the sense amplifier that are functional for the operation of the present invention. The sense amplifier 12 contains a first and second PMOS input transistors 14*a,b*, each with a source connected to a respective one of the bitlines 11*a,b*. The drain of each PMOS input transistor 14*a,b* is coupled to the gate of the other PMOS input transistor 14*a,b*. The drains of the first and second input transistor 14*a,b* are coupled to a common node 18 via the channels of a first and second PMOS load transistor 16*a,b* respectively.

In operation, the memory cell 10 is conductively connected to the bit-lines 11*a,b* during sensing and starts to draw current from those bit lines 11*a,b*, more from one bitline 11*a,b* than from the other, dependent on the state of the memory cell 10.

The sense amplifier 12 regulates the difference between the potentials of the bitlines 11*a,b* to zero. The potential difference between the bit lines 11a,b is the sum of successively the source gate voltage of the first input transistor 14a, the gate-source voltage of the second load transistor 16b, the source-gate voltage of the first load transistor 16a and the gate-source voltage of the second input transistor 14b:

$$V(11a-11b)=-Vgs(14a)+Vgs(16b)-Vgs(16a)+Vgs(14b)$$

This potential difference is already fairly constant because of the high transconductance g (ratio between channel current changes and gate source voltage changes) of transistors: changes in Vgs are a factor 1/g smaller than the changes in current due to the memory cell.

In addition, the cross-coupling between the gates and drains of the input transistors 14a,b means that when the memory cell 10 pulls up the source potential of one input transistor 14a,b so that the current through the channel of that input transistor 14a,b goes up, the load transistor 16a,b connected to that channel makes the gate potential of the other input transistor 14a,b rise so that the source potential of the other input transistor also rises. Thus, the potential difference between the bit lines is counteracted. Because the cross-couplings form a loop, this counteraction is enhanced by a feedback effect.

Ideally, when the current variations caused by the memory cell 10 give rise to equal but opposite gate source potential changes in the input transistor 14a,b and the load transistor 16a,b whose channels are connected:

$$dVgs(14a)=-dVgs(16a) \text{ and } dVgs(14b)=-dVgs(16b))$$

the potential difference between the bitlines 11a,b is completely suppressed.

It is important to note that the direction of gate-source voltage drops in the sense amplifier 12 alternate. All of the nodes of the sense amplifier 12 are connected to other nodes via gate source transitions. No two of these transitions are in series with a gate-source voltage drop in the same direction. Consequently, the potentials of none of the nodes in the sense amplifier 12 is more than one gate source voltage away from any other node in the sense amplifier 12.

As a result the sense amplifier 12 will operate down to a very low supply voltage. Also, the backgate bias of the input transistors 14a,b and the load transistors 16a,b will match closely, so that the source gate voltage drop across the input transistors 14a,b and the load transistors 16a,b will match each other closely at equal channel current.

Instead of the PMOS load transistors 16a,b one might use NMOS load transistors, with their gates coupled to their drains, that is to the common node 18. However, this would require more complicated transistor matching when one wants to ensure that current variations caused by the memory cause the same gate-source voltage but opposite variations in the load transistors 16a,b and the input transistors 14a,b.

Figure 2:
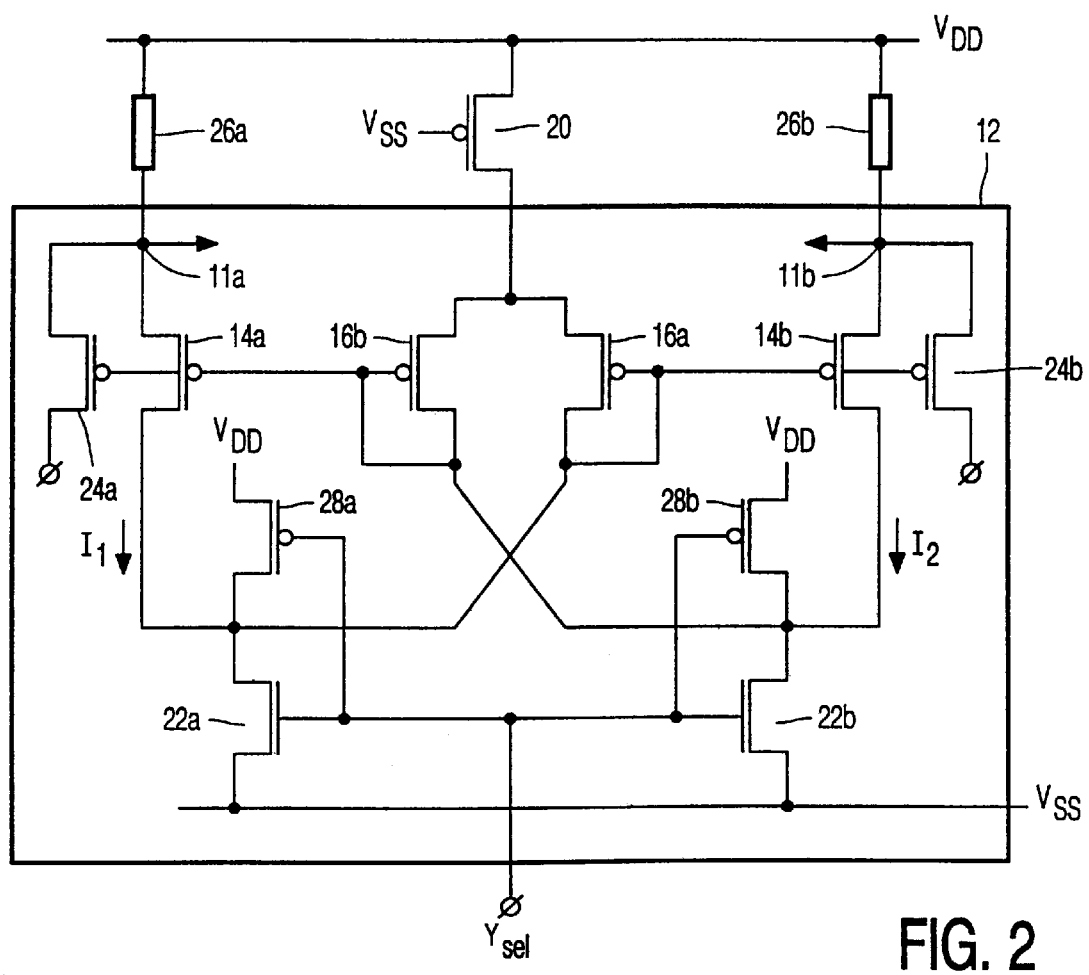
FIG. 2 shows an embodiment of a sense amplifier

FIG. 2 shows an embodiment of a sense amplifier 12. In addition to the elements shown in FIG. 1, FIG. 2 shows a first and second power supply connection Vdd, Vss. The bit lines 11a,b are connected to the first power supply connection Vdd via loads 26a,b respectively.

In addition to the elements shown in FIG. 1, the sense amplifier 12 contains a first and second NMOS current source transistor 22a,b, a PMOS common impedance transistor 20 and PMOS output transistors 24a,b.

The connection of the drains of the first input transistor 14a and the first load transistor 16a is connected to the second power supply connection Vss via the channel of the first NMOS current source transistor 22a. The connection of the drains of the second input transistor 14b and the second load transistor 16b is connected to the second power supply connection Vss via the channel of the second NMOS current source transistor 22b. The gates of the NMOS current source transistors 22a,b are connected to one another and to a select input Ysel.

The common node 18 is connected to the first power supply connection Vdd via the channel of the common impedance transistor 20. The gate of the common impedance transistor 20 is coupled to the second power supply connection Vss.

The gate and source of the first PMOS output transistor 24a are coupled in parallel to the gate and source of the first input transistor 14a. The gate and source of the second PMOS output transistor 24b are coupled in parallel to the gate and source of the second input transistor 14a.

In operation, the first and second NMOS current source transistor 22a,b serve to ensure that current changes through the input transistors 14a,b are transferred completely to the load transistors 16a,b, so that these input and load transistors that are connected by their drains have opposite current changes. This makes it easier to ensure that current variations caused by the memory cause the same gate-source voltage but opposite variations in the load transistors 16a,b and the input transistors 14a,b. Instead of current sources other impedance circuits may be used, but then the current change in the load transistors will be less.

Preferably, each current source transistor 22a,b supplies twice the quiescent current that flows from each bitline 11a,b through each input transistor 14a,b. Thus, the quiescent current through the load transistors 16a,b will be the same as the current through the input transistors 14a,b ensuring equal potential on the bit lines 11a,b when the input and load transistors are of the same size. Thus, gate-source voltage change of the load transistors 16a,b and the input transistors 14a,b in response to current changes will match more closely. This makes it easier to ensure that current variations caused by the memory cause the same gate-source voltage but opposite variations in the load transistors 16a,b and the input transistors 14a,b.

The output transistors 24a,b draw an output current that is proportional to the current through the input transistors 14a,b this current may be used to drive an output circuit (no shown).

The common impedance transistor 20 preferably provides the same voltage drop as the average voltage drop across the loads 26a,b. Thus, gate-source voltage change of the load transistors 16a,b and the input transistors 14a,b in response to current changes will match more closely. If the output transistors 24a,b draw n times the current of the input transistors 14a,b, then the current through the bit lines is n+1 times the current through the input transistors 14a,b. Hence, the source-drain impedance of the impedance transistor 20 should be approximately (n+1)/2 the impedance connected to the bitlines to provide the same voltage drop.

The current source transistors 22a,b are preferably used to switch the sense amplifier on and off. For this purpose, the gates of these current source transistors 22a,b receive a selection signal Ysel. If this signal Ysel is low, the sense amplifier is switched off and no current is consumed. If the signal Ysel is high the sense amplifier is active.

A small signal analysis of the sense amplifier shows that the frequency dependent behavior of the sense amplifier depends on the gate source capacitance Cc of the input transistors 14a,b, the drain-Vss capacitance Ca of the input transistors 14a,b and to a lesser extent on the bit-line capacitance Cb. Furthermore the response depends on the transconductance of the input transistors 14a,b and mg of the load transistors 16a,b. In terms of a complex frequency s (i*2*pi*f), the difference between the bitline voltages Vx, Vy will be a linear function of the difference between the currents I1, I2 through the input transistors 14a,b:

$$Vx-Vy=\{((m-1)g+s(Ca+Cc))/(mg+sCa)\}*(I1-I2)/g$$

for small frequency s and m near 1 this difference is small. Thus is it seen that the sense amplifier has the desired effect of keeping the bitline potentials equal. The differential output current Io of the sense amplifier divided by the memory cell Ic current is approximately given by $$Io/Ic=K/(1+s*2B/A+s*s/(A*A))$$

that is, the differential output current response to input current changes has a zero frequency gain "K", with $$K=n/(n+1)$$

(n is the factor between the W/L ratio of the input transistors 14a,b and the W/L ration of the output transistors 24a,b). The output current response has a second order frequency dependence with a resonance peak near a frequency A, where $$A=g\ \text{sqrt}([n+1]/[(Ca+Cc)*Cb])$$

(sqrt( ) being the square root function). The damping factor "B" of the resonance is $$B=0.5*\{1/(g*Rb)+Cb(m-1)/(Ca+Cc)\}/\text{sqrt}\{(n+1)*Cb/(Ca+Cc)\}$$

(Rb is the impedance of the loads connected to the bitlines 10a,b). It will be noted that the damping factor is certainly greater than zero if m is greater than or equal to 1. In fact, it is preferred that m>1 to ensure stability of the circuit. To reduce ringing, it is desirable that B>0.5. This can be ensured by selecting m greater than one.

As a result, equalization of the bit line voltage will not be perfect, but still sufficient, but the damping factor B will increase both for low bitline capacitance values Cb and high bitline capacitance values Cb.

This is especially advantageous for use of the sense amplifier in a library of circuits, used for embedding memories of varying size in various circuits design. In this case, the sense amplifier does not need to be redesigned to ensure stability for different size memories.

In an example of the sense amplifier gRb=1/3, n=3 Cb=1pF and Ca+Cc=0.2pF. In this case a value of at least 1.29 for m ensures that the damping factor B is greater than or equal to 0.5.

The delay of the sense amplifier is given by $$\text{delay}=\{(Ca+Cc)/(g*Rb)+Cb(m-1)\}/\{(n+1)*g\}$$

When m=1 this delay is independent of the bitline capacitance. For example, when n=3, Ca+Cc=0.2pF, gRb=1/3, m=1 and g=1/(7 kOhm) a delay value of 1.1 nSec will be found. This delay can be realized for a supply voltage of as low as 1.5 Volt. If m>1, to ensure stability, the delay will increase slightly with bitline capacitance Cb, but the dependence on the bitline capacitance is only slight as long as m is near 1.

This also makes the sense amplifier very suitable for use in a library of circuits, used for embedding memories of varying size in various circuits design.

In addition, the sense amplifier uses only a small semiconductor substrate area, since it contains only nine transistors of which only two have more than a minimum size. Only one control signal Ysel is used, which is not critical with respect to timing. Little current is consumed, typically not more than four times a memory cell current.

Figure 3:
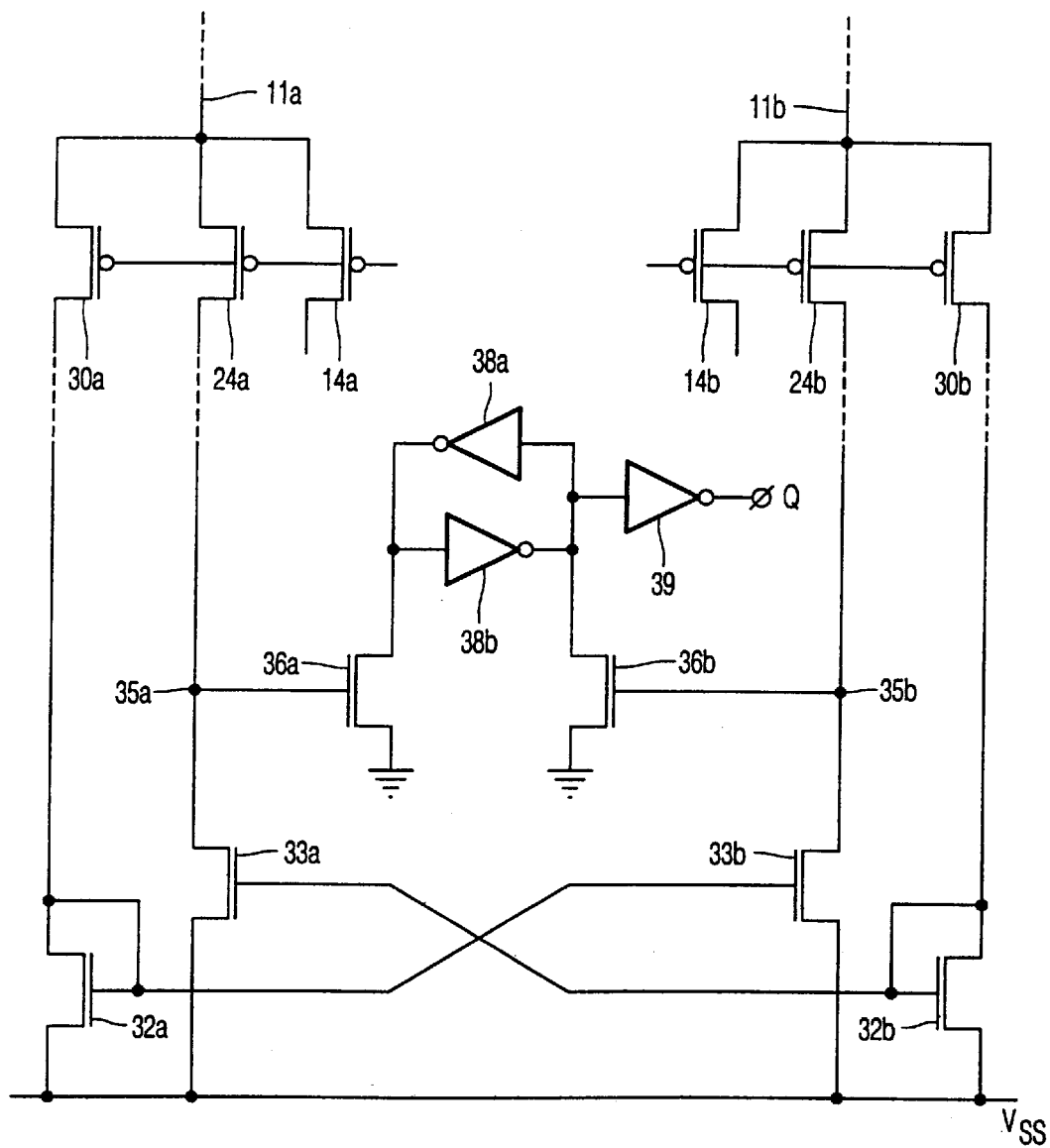
FIG. 3 shows an output buffer

FIG. 3 shows an output buffer for a current sense amplifier. The output buffer is coupled to the sense amplifier shown in FIG. 1 or 2. For clarity only those parts of the sense amplifier are shown that connect to the output buffer.

FIG. 3 shows the bit lines 11a,b, the input transistors 14a,b, the first and second output transistors 24a,b and first and second further output transistors 30a,b. The sources of the first input transistor 14a, the first output transistor 24a and the first further output transistor 30a are connected to one another and the first bitline 11a. The gates of the first input transistor 14a, the first output transistor 24a and the first further output transistor 30a are also connected to one another. Similarly, the sources of the second input transistor 14b, the second output transistor 24b and the second further output transistor 30b are connected to one another and the second bitline 11b. The gates of the second input transistor 14b, the second output transistor 24b and the second further output transistor 30b are also connected to one another.

The drains of the first and second output transistor 24a,b that are connected to a first and second output node 35a,b respectively. The drains of the first and second further output transistor 30a,b are coupled cross-wise to the second and first output node via a first current mirror 32a, 33b and a second current mirror 32b, 33a respectively.

The output buffer further comprises pull-down transistors 36a,b and cross-coupled inverters 38a,b. The first and second output node 35a,b are coupled to the gate of the first and second pull-down transistor 36a,b respectively. The sources of these pull-down transistors 36a,b are connected to Vss and their drains are connected to the input of respective ones of the cross-coupled inverters 38a,b. An output inverter 39 is coupled to the input of one of the cross-coupled inverters 38a,b.

In operation the output transistors 24a,b and the further output transistors 30a,b all receive gate source voltages that are determined by the current differences between the bitlines 11a,b. As a result the current flowing from the drains of these transistors 24a,b 30a,b also differ in proportion to the differences between the bit-line 11a,b currents. The currents from the output transistors flow directly to the output nodes 35a,b. The currents flowing from the further output transistors 30a,b are reflected cross-wise to the output nodes 35a,b. Therefore the current that flows from each output node 35a,b is proportional to the current that flows into the other output node 35a,b.

The combination of transistor sizes of the further output transistors 30a,b and the current mirror transistors 32a,b, 33a,b is designed relative to the transistor size of the output transistors 24a,b, so that the current flowing out of each output node 35a,b via the relevant current mirror 32a,b 33a,b is a factor "F" larger than the current flowing into the other output node 35a,b from the output transistor 24a,b that is connected to the other output node 35a,b. The factor F is a compound of the ratio "A" (W1/L1)/(W2/L2) of W/L ratios W1/L1 of the further output transistors 30a,b and the output transistors 24a,b and a current amplification factor B of the current mirrors: F=B/A.

The factor "F" is designed to be greater than one, but smaller than the ratio between the currents from the two bitlines 11a,b when a memory cell is connected to the bitlines 11a,b. This ratio serves to ensure that both output nodes 35a,b will be pulled low when no memory cell is actively connected to the bitlines 11a,b and one of the output nodes 35a,b is pulled up when a memory cell is actively connected. Which one of the output nodes 35a,b is pulled up depends on the bit stored in the memory cell.

Thus the cross-coupled inverters 38a,b will remain in the same state as long as no memory cell is actively connected to the bit-lines 11a,b. As a result, no reset of the output buffer is needed before active connection of the memory cell. Only one of the two possible bit-values stored in the memory cell will cause power consumption for switching over the cross-coupled pair of inverters 38a,b.

Apart from its use in a current sense amplifier, the output stage may also be used in comparators for example in A/D or D/A converters.

After completion of sensing, the currents flowing through the output transistors 24a,b and the further output transistors 30a,b may be switched off. In this state, no DC current will be drawn by the output buffer, saving additional power consumption.

The output buffer is very fast and works down to low voltage. In an embodiment W/L ratios of 32 were used for the output transistors 24a,b and 16 for the further output transistors 30a,b, and W/L ratios of 2.8 for the input transistors 32a,b of the current mirrors and 6.8 for the output transistors 33a,b of the current mirrors. A W/L ratio of 8 was used for the pull-down transistors 36a,b and 0.93/0.35 and 1.46/0.55 were use for the (PMOS W/L)/(NMOS W/L) ratios in the cross-coupled inverters 38a,b (the inverter 38b that is coupled to the output inverter having the largest W/L values). This resulted in a read delay of only 0.98 nsec at a supply voltage of 1.5 Volt. The circuit remained operable to below 0.5 V supply voltage (with increasing delay). At 2.5 Volt supply voltage, the delay was 0.64 nsec.

Of course, other output stages may also be used in combination with the sense amplifier of FIG. 2. For example one might use only one output node 35a, and only one current mirror 32b, 33a, taking equal gain from the output transistors 24a and the combination of the further output transistor 30b and current mirrors 32b, 33a. Thus the one output node 35a can be used as logic output. In another example, first and second NMOS current mirrors may be connected to the first and second output transistor 24a,b respectively, the output of the first NMOS current mirror being coupled directly to a logic output node, the output of the second NMOS current mirror being coupled to the output node via a PMOS current mirror. Many circuit variations of output buffers using the current from the output transistors 24a,b or their gate source voltage are possible.

What is claimed is:

1. An integrated circuit comprising a memory that includes:

memory bit lines;

a first and second input transistor with cross-coupled gates and drains, each transistor having a source coupled to a respective one of the memory bit lines;

a common node;

a first and second load transistor, the drains of the first and second input transistor being coupled to the common node via source-gate links of the first and second load transistor respectively, current transfer connections between the drains of the first and second input transistor and a source-drain channel of the first and second load transistor respectively, characterized in that gate/source voltage drops of the first and second load transistor are arranged in a direction opposite to a direction of gate/source voltage drops of the first and second input transistor between the memory bit lines and the common node.

2. The integrated circuit according to claim 1, wherein the first and second input transistor and the first and second load transistor are all of the same conductivity type, the gate of the first and second load transistor being coupled to the drain of the first and second input transistor respectively.

3. The integrated circuit according to claim 2, wherein the source of the first and second input transistor are coupled to a first power supply node via the bit lines, the common node being coupled to the first power supply connection via a common current source circuit.

4. The integrated circuit according to claim 1, wherein the of the drains of the first and second input transistor are coupled to a second power supply connection via a first and second current source respectively.

5. The integrated circuit according to claim 4, wherein the first and second current source are switchable between a zero current state when memory reading is disabled and a current supply state when memory reading is enabled.

6. The integrated circuit according to claim 5, wherein the first and second current source comprise a switching element, for pulling the drains of the first and second input transistor to a supply potential on the first power supply connection in the zero current state.

7. The integrated circuit according to claim 4, comprising a first and second output transistor with source and gate terminals connected in parallel to source and gate terminal of the first and second input transistor respectively, the first and second output transistor having a drain coupled to an output of the memory.

8. The integrated circuit according to claim 7, comprising a memory cell coupled to the bitlines, wherein the drain of the first output transistor is coupled to an output node and the drain of the second output transistor is coupled to the output node via a current mirror, so that the first and second output transistor determine a supply and a drain of current from the output node respectively, a current gain of the first output transistor being a factor smaller than a combined current gain of the second output transistor and the current mirror, the factor being less than one, but greater than a ratio between currents drawn by the bitlines when the memory cell is actively connected to the bitlines.

9. An integrated circuit comprising memory bitlines, a memory cell coupled to the memory bitlines and a current sense amplifier coupled to the memory bitlines and having a first and second output transistor having drains for supplying buffered differential currents determined by a logic state of the memory cell, characterized in that the drain of the first output transistor is coupled to an output node and the drain of the second output transistor is coupled to the output node via a current mirror, so that the first and second output transistor determine a supply and a drain of current from the output node respectively, a current gain of the first output transistor being a factor smaller than a combined current gain of the second output transistor and the current mirror, the factor being less than one, but greater than a ratio between currents drawn by the bitlines when the memory cell is actively connected to the bitlines.

* * * * *